United States Patent
Anderskouv et al.

(10) Patent No.: US 8,098,091 B1
(45) Date of Patent: Jan. 17, 2012

(54) METHOD IN THE COMPENSATION OF UNLINEARITIES IN AN AMPLIFIER, AND USES OF THE METHOD AND THE AMPLIFIER

(75) Inventors: Niels Anderskouv, Dallas, TX (US); Lars Risbo, Copenhagen (DK); Thomas Morch, Soborg (DK)

(73) Assignee: Texas Instruments Denmark, Lyngby (DK)

( * ) Notice: Subject to any disclaimer, the term of this patent is extended or adjusted under 35 U.S.C. 154(b) by 0 days.

(21) Appl. No.: 09/623,554

(22) PCT Filed: Mar. 3, 1999

(86) PCT No.: PCT/DK99/00102
§ 371 (c)(1), (2), (4) Date: Jun. 15, 2001

(87) PCT Pub. No.: WO99/45641
PCT Pub. Date: Sep. 10, 1999

(30) Foreign Application Priority Data

Mar. 3, 1998 (DK) ..................................... 0283/98

(51) Int. Cl.
*H03F 21/00* (2006.01)
(52) U.S. Cl. ............................................ 330/11; 330/10
(58) Field of Classification Search .................... 330/11, 330/10, 207 A, 251
See application file for complete search history.

(56) References Cited

U.S. PATENT DOCUMENTS

| | | | |
|---|---|---|---|
| 4,061,930 A | 12/1977 | Nerem | 307/254 |
| 4,820,940 A | 4/1989 | Wachi et al. | 307/270 |
| 5,410,592 A | 4/1995 | Wagner et al. | 379/388 |
| 5,815,581 A | 9/1998 | Andersson | 381/68.4 |
| 7,629,840 B2 * | 12/2009 | Midya et al. | 330/10 |
| 7,733,171 B2 * | 6/2010 | Guilherme et al. | 330/10 |
| 7,839,211 B2 * | 11/2010 | Nielsen | 330/10 |
| 7,893,743 B2 * | 2/2011 | Fenger et al. | 327/172 |
| 7,956,681 B2 * | 6/2011 | Guilherme et al. | 330/10 |

FOREIGN PATENT DOCUMENTS

| | | |
|---|---|---|
| EP | 0 503 571 A1 | 9/1992 |
| EP | 0 753 934 A1 | 1/1997 |

* cited by examiner

*Primary Examiner* — Henry Choe
(74) *Attorney, Agent, or Firm* — William B. Kempler; Wade J. Brady, III.; Frederick J. Telecky, Jr.

(57) ABSTRACT

In a method and an amplifier for the compensation of unlinearities e.g. of the class D type, wherein an audio signal is pulse-width modulated, e.g. with a carrier wave signal in the form of a triangular signal to provide a pulse-width modulated small-signal, the so-called multiplicative error signals, which occur prior to the provision of a pulse-width modulated great-signal (7), are detected in a detector (10)).

Figure 1:
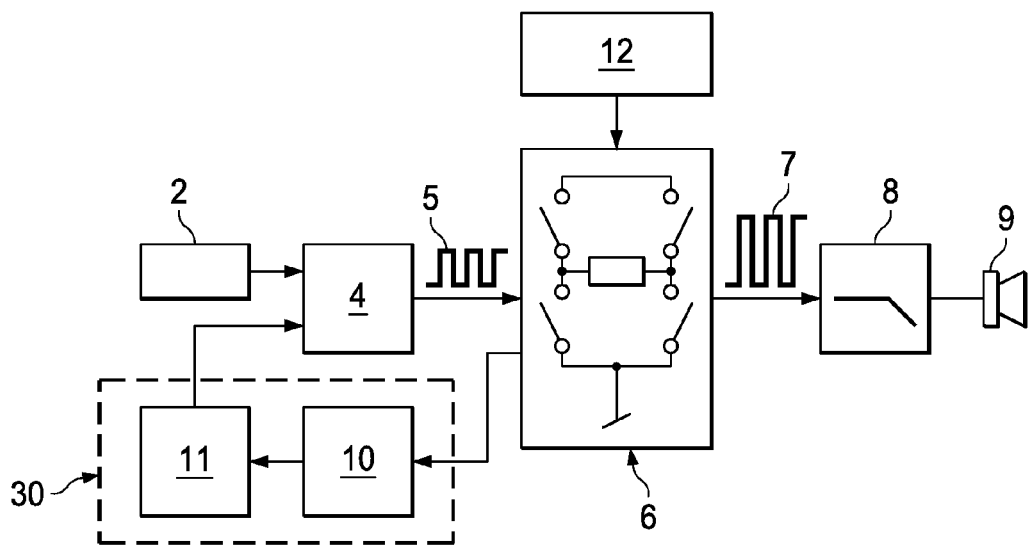

It is noted that the carrier wave signal could be analog as well as digital.

The signal from the detector, which is derived on the basis of differences between the pulse widths of the small-signals and the pulse widths of the great-signals, is used for changing the carrier wave signal so that the amplifier gets a constant gain in the entire audio range and is thereby linearized.

To compensate additionally for the multiplicative errors which manifest themselves in the pulse height as well as the pulse width of the pulse-width modulated great-signal (7), the value of the carrier wave signal is changed as a function of the pulse-width modulated small-signal (5) multiplied by the pulse-width modulated great-signal and the inverted pulse-width modulated small-signal multiplied by the inverted pulse-width modulated great-signal.

12 Claims, 6 Drawing Sheets

METHOD IN THE COMPENSATION OF UNLINEARITIES IN AN AMPLIFIER, AND USES OF THE METHOD AND THE AMPLIFIER

The invention relates to a method in the compensation of unlinearities in an amplifier consisting of a pulse-width modulator wherein a signal is pulse-width modulated to provide a pulse-width modulated small-signal, and wherein the pulse-width modulator has an output controlling a set of change-over switches which feed a load with a pulse-width modulated great-signal by means of a voltage supply.

The invention moreover relates to an amplifier of the type comprising a pulse-width modulator adapted to pulse-width modulate a signal to provide a pulse-width modulated small-signal, said pulse-width modulated signal being fed to at least two change-over switches adapted to connect and disconnect a voltage supply to form a pulse-width modulated great-signal, and having means to compensate for error signals which occur in the signal paths between the pulse-width modulated great-signal and the pulse-width modulated small-signal.

Finally, the invention relates to uses of the amplifier.

Traditional amplifiers for audio uses are used for amplifying audio signals and for forming sound images in loudspeakers. These amplifiers, however, do not have very high efficiencies.

Therefore, amplifiers are being designed according to other principles. These high efficiency amplifiers include those which are based on pulse-width modulation. These amplifiers are also referred to as class D amplifiers.

Such an amplifier consists of a pulse-width modulator, a set of change-over switches and a low-pass filter.

The principle of a class D amplifier is that two change-over switches are switched to conduct and non-conduct, respectively, depending on the amplitude of a signal, such as an audio signal. The information of the audio signal is hereby converted into a series of pulses whose width corresponds closely to the information of the audio signal.

Instead of two change-over switches, it is possible to use four change-over switches which are caused to conduct and non-conduct in pairs.

Pulse-width modulated amplifiers are theoretically very linear and thereby have a very low distortion, but practical realizations have shown that unlinearities are unfortunately formed in these amplifiers, which has prohibited the use of these as High Fidelity amplifiers unless strong negative feedback systems have been established.

However, establishment of feedback systems in pulse-width modulated amplifiers is not an easy task, since negative feedback performed prior to the low-pass filtering causes much noise in the system.

Furthermore, the load impedance, which is a loudspeaker, is incorporated in the design of the feedback system, and since this impedance may vary depending on loudspeaker selection, the design is thus impeded by the feedback system.

A great part, but not an exclusive part, of the unlinearities in pulse-width modulated amplifiers occurs because the voltage supply to the change-over switches is not constant in the operation of the amplifier.

The reason is that the gain in pulse-width modulated amplifiers is derived from the supply voltage to the change-over switches incorporated in the amplifier, divided by the peak voltage of the carrier wave, which is typically a saw-toothed or triangular signal. The gain of the amplifier is thus proportional to the supply voltage, so that variations in it cause a so-called multiplicative error to occur on the output signal from the change-over switches.

A regulated voltage supply may be used to eliminate unlinearities, but a very complex power supply circuit is required for sufficiently linear properties to be achieved, which adds considerably to the costs of the amplifier.

Moreover, it is known that the dead time, which is the time where none of the change-over switches is made, causes distortion of the amplified signal.

It is therefore desirable to reduce the dead time to a minimum in pulse-width modulated power amplifiers. Conversely, less dead time causes problems of increased power consumption and strong ringing on the output signal, because both change-over switches carry current from the supply directly down into earth.

The known methods of linearizing pulse-width modulated amplifiers require strong negative feedback, as mentioned. These methods are particularly unuseful for consumer amplifiers, where design criteria such as low complexity and general usefulness in a broad range of load are important.

Finally, 0 503 571 A1 discloses a class D amplifier in which variations in the voltage supply are compensated by changing the carrier wave signal as a function of an error in the voltage supply.

On the other hand, other errors that may cause errors in the pulse widths of the pulse-width modulated great-signal will not be included in the compensation.

Accordingly, an object of the invention is to provide a method which is capable of linearizing and compensating for all errors which occur between the signal paths of a pulse-width modulated small-signal and a pulse-width modulated great-signal.

The object of the invention is achieved by the method defined in the introductory portion of claim 1 which is characterized in that the inevitable error, which manifests itself in that the pulse widths of the pulse-width modulated great-signal differ from the pulse widths of the pulse-width modulated small-signal, is detected as an error signal which is used for changing the pulse-width modulation, said pulse-width modulated small-signal being varied in a manner which corresponds to the detected error signal.

When, as stated in claim 2, the error signal is detected as a multiplicative error signal, it is relatively easy to modulate the carrier wave signal as a function of the multiplicative error signal.

As stated in claim 3, the detected multiplicative error signal is determined as the pulse-width modulated small-signal multiplied by the pulse-width modulated great-signal and the inverted small-signal multiplied by the inverted pulse-width modulated great-signal.

A further circuit-technical advantage is achieved hereby as the compensating circuit both compensates for the multiplicative errors in the pulse width and additionally for the pulse height that occurs in the change-over switches. In addition, a simple implementation of the invention is achieved.

It is noted that the method is particularly suitable for compensating for multiplicative errors in an H-bridge which is operated in class AD operation.

Expediently, as stated in claim 4, the pulse-width modulation is performed by means of a carrier wave signal, which is particularly expedient for use in the pulse-width modulation of analogue signals, when the carrier wave signal is analog.

It is however also possible to use a carrier wave signal that is digital.

For simple circuit design of the pulse-width modulation, it is an advantage if, as stated in claim 5, a saw-toothed or triangular carrier wave signal is used.

When, as stated in claim 6, the slew rate of the carrier wave is adjusted by an external signal, it is ensured that the gain of the compensated amplifier may be varied over a great range.

As mentioned, the invention also relates to an amplifier. This amplifier is characterized in that the means for compensating for the error signals are formed by a detector adapted to detect deviations between the pulse widths of the great-signals and of the small-signals, and that the output of the detector is connected to a controlled carrier wave generator.

An amplifier is hereby provided in which inevitable unlinearities, which manifest themselves by differences between the pulse-width modulated small-signals and the pulse-width modulated great-signals, may be eliminated without complicated feedback stages.

Expedient embodiments of the amplifier are defined in claims 8-10.

Finally, the invention relates to uses of the method and the amplifier, as mentioned.

The use according to claim 11 allows a much simpler structure to be provided than the negative feedbacks traditionally used in pulse-width modulated amplifiers.

The use according to claim 12 allows the amplifier to be used for the control of resistive and reactive loads, which are e.g. found in electric motors, physical laboratory equipment, measuring apparatus, etc.

Figure 2:
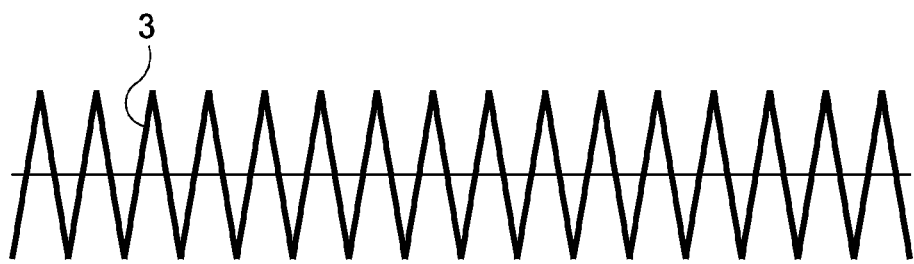
Figure 3:
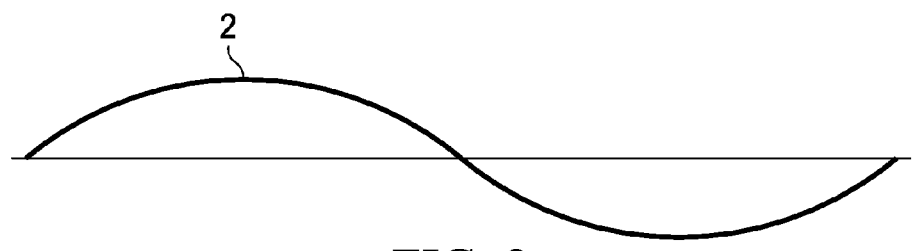
Figure 4:
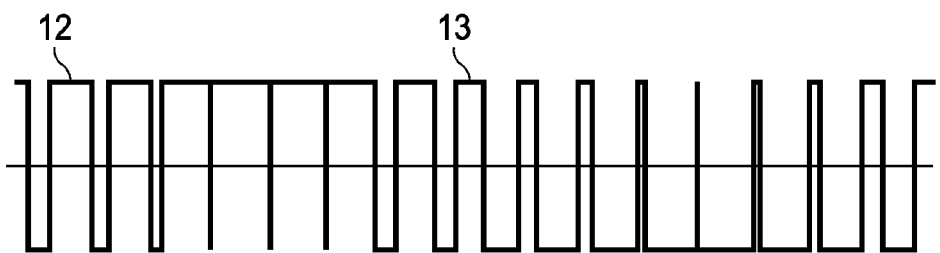
Figure 5:
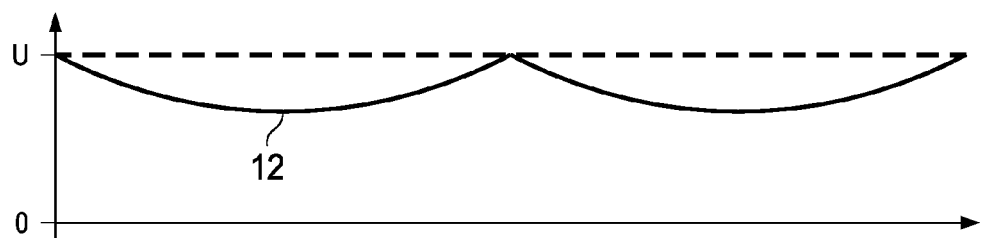
Figure 6:
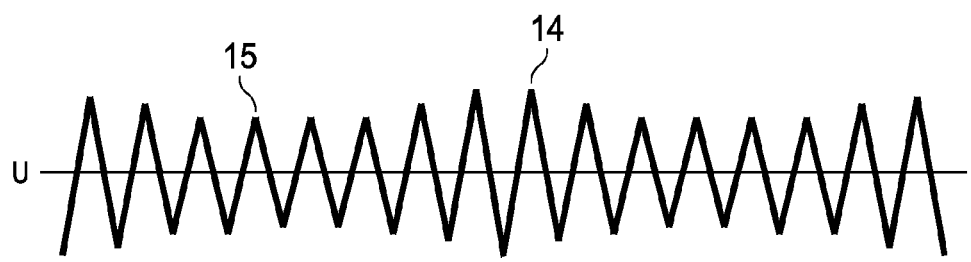
Figure 7:
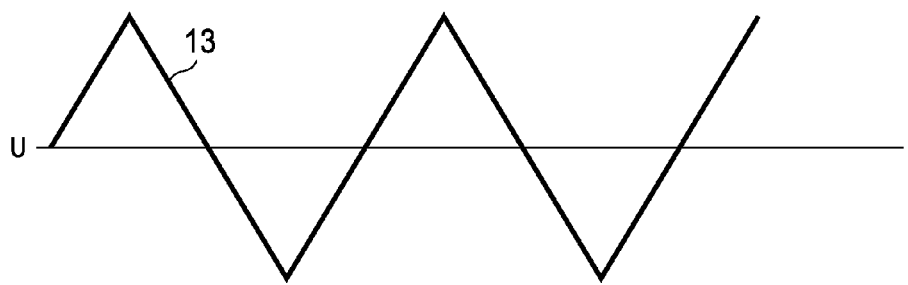
Figure 7A:
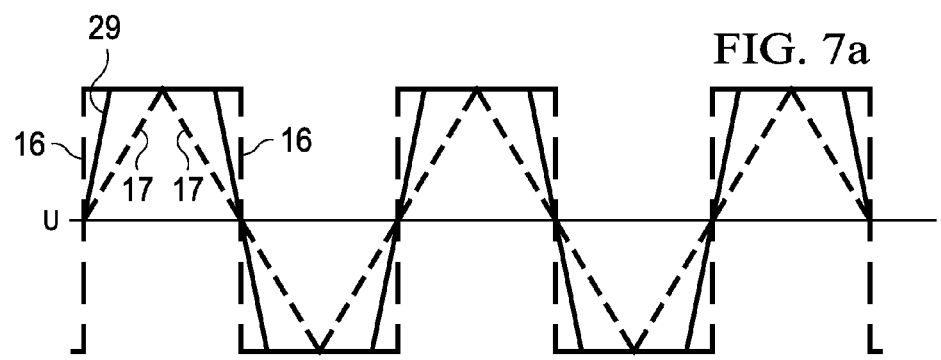
Figure 8:
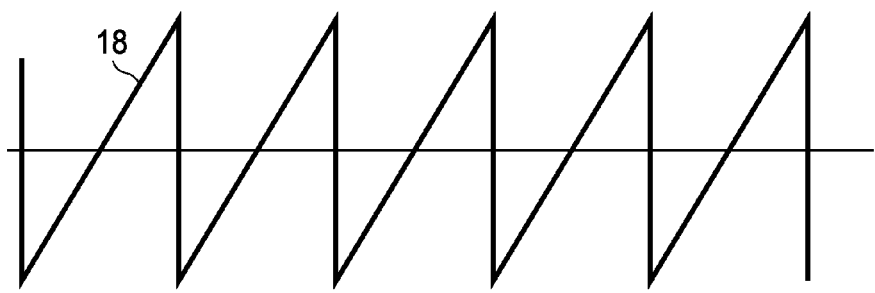
Figure 8A:
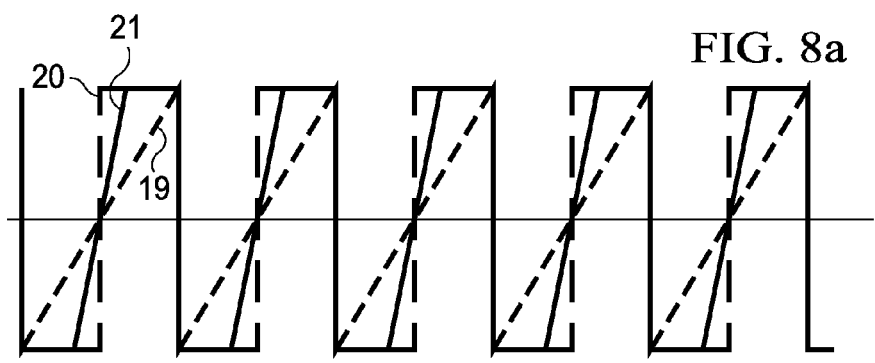
Figure 9:
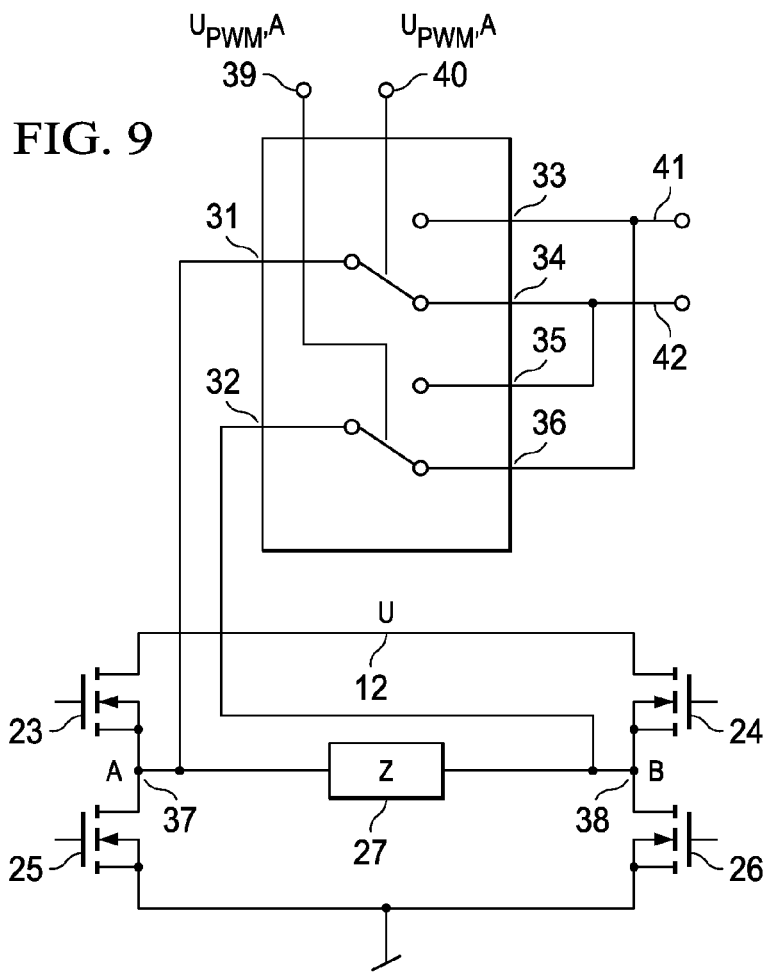
Figure 10:
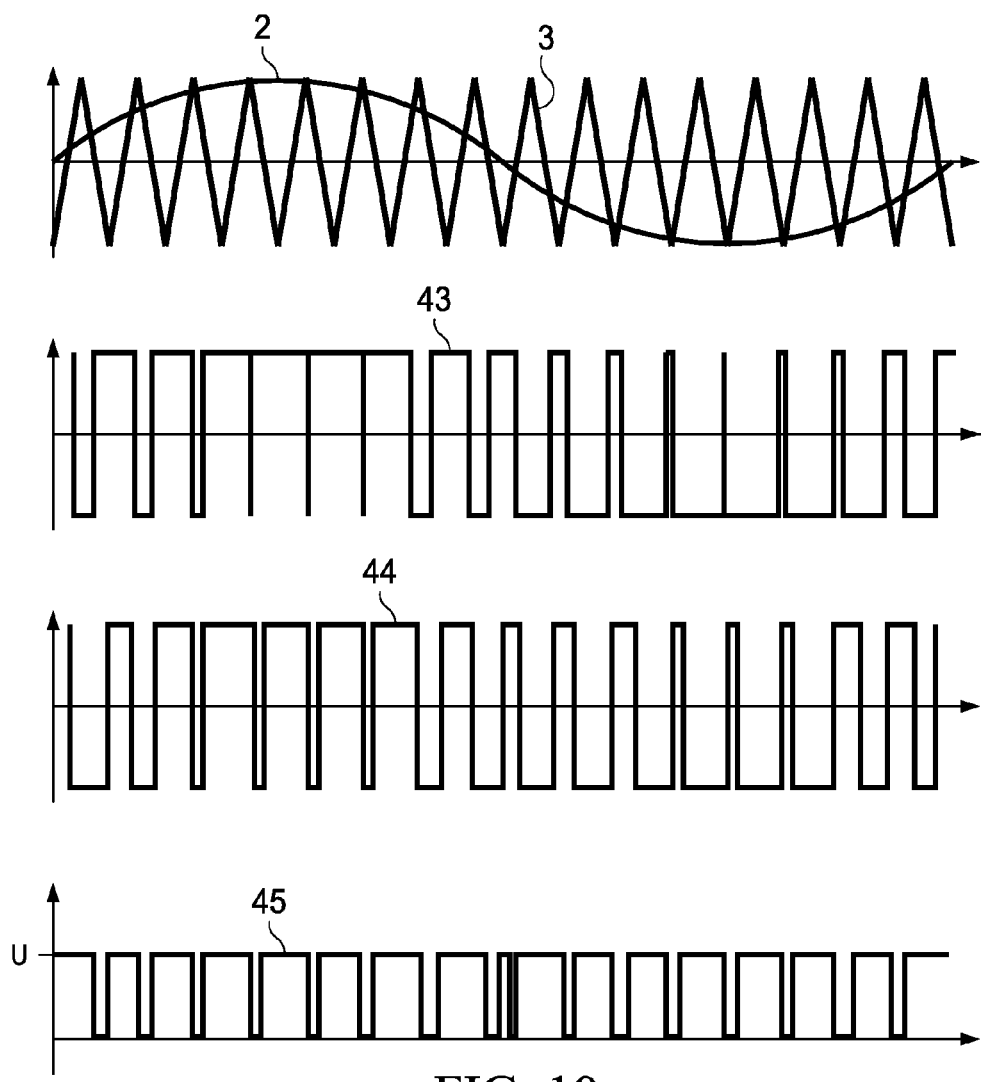
Figure 11:
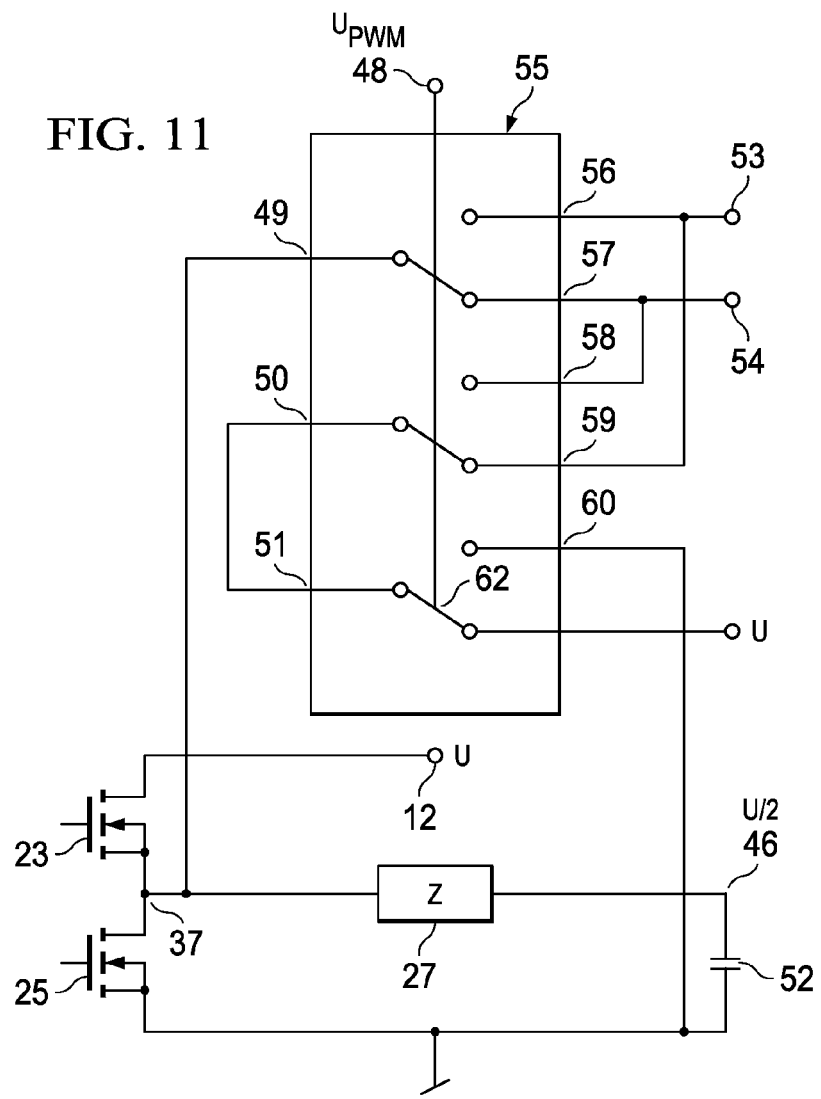

The invention will now be explained more fully with reference to an embodiment of the invention shown in the drawing, in which FIG. 1 shows the basic structure of the invention in a block diagram form, FIG. 2 shows an example of a carrier wave signal, FIG. 3 shows an example of a signal which may be modulated by the signal of FIG. 2, FIG. 4 shows the signal of FIG. 3 pulse-width modulated, FIG. 5 shows an example of variations in the voltage supply of the amplifier as a function of the signal of FIG. 3, FIG. 6 shows the modulation of the carrier wave signal of FIG. 2, FIGS. 7 and 7A show a triangular carrier wave signal whose characteristic is changed, FIGS. 8 and 8A show a saw-toothed carrier wave signal whose characteristic may be changed, FIG. 9 shows a first example of a circuit array for use in the detection of multiplicative errors, FIG. 10 shows an example of the signal shapes in the first detecting circuit, and FIG. 11 shows an example of a second circuit for the detection of multiplicative errors in a half-brige or a multiple thereof.

In FIG. 1, the numeral 2 shows a signal which may be pulse-width modulated in a pulse-width modulator 4, e.g. with the shown carrier wave signal 3, where the carrier wave signal, in addition to the triangular shape shown, may be saw-toothed. The pulse-width modulation may provide the small-signal pulse-width modulated signal 5 shown which may control a set of change-over switches 6. A supply voltage 12 is applied to the change-over switches 6, whereby they provide a pulse-width modulated great-signal 7 having an amplitude which is given by the supply voltage 12 and the position of the change-over switches 6. The pulse-width modulated great-signal 7 is filtered through a low-pass filter 8, and the resulting signal is applied to a load, here shown as a loudspeaker 9.

FIG. 1 additionally shows a compensating circuit 30 which consists of a voltage sensor 10 and a controllable carrier wave modulator 11. It is noted that this carrier wave modulator could be implemented in an analog as well as digital version.

The supply voltage 12 is detected by the voltage sensor 10 which provides a control signal for the carrier wave modulator 11. The carrier wave modulator 11 thus modulates the carrier wave signal 3 with the signal generated by the voltage sensor, so that the amplifier is compensated for the inevitable unlinearities which are created by the varying supply voltage.

FIG. 2 shows an example of an uncompensated carrier wave signal which is capable e.g. of modulating the signal 2 shown in FIG. 3 by means of the pulse-width modulator 4, so as to provide the pulse-width modulated signal shown in FIG. 4.

If the change-over switches 6 are fed from an uncontrolled voltage supply, the supply voltage may assume a shape as shown at 12 in FIG. 5. As will be seen, the supply voltage now consists of a DC value which is superposed by a rectified sine voltage. This supply voltage will give rise to serious unlinearities in the amplifier, which, of course, gives rise to strong unlinearities in it. Compensation for these deviations must therefore be provided.

FIG. 6 shows an example of a compensated carrier wave signal 15. The peak value of this signal 15 varies as a function of the variation of the supply voltage, cf. FIG. 5, to the change-over switches. The compensated carrier wave signal 15 shown in FIG. 6 is characteristic by having a constant frequency, but nothing prevents the compensation from being performed such that the derivative of the voltage of the carrier wave signal on the modulating flanks is numerically constant, thereby allowing the frequency of the carrier wave signal to be varied.

As will appear from FIGS. 7 and 7A, the carrier wave 3 may be compensated according to another principle where the carrier wave may basically be given e.g. by a carrier wave signal 29 which is frustoconical. The first derivative of the modulating flanks of this signal is seen to be numerically greater than the modulating flanks of the previously mentioned triangular signal. As a result, the amplifier has a lower gain, even though the peak-to-peak value is maintained. It will thus be seen that for a maintained peak-to-peak value of the carrier wave signal the numerical value of the first derivative of the carrier wave signal may be varied so that the shape of the resulting carrier wave signal varies between the signal shapes shown at 16 and 17.

FIGS. 8 and 8A show a second compensating principle for the carrier wave, e.g. as shown at 21. The first derivative of the modulating flank of this carrier wave signal is seen to be greater than the first derivative of the saw-toothed carrier wave signal, which causes the amplifier to have a lower gain, even though the peak-to-peak value of the carrier wave signal is maintained. It will be seen that for a maintained peak-to-peak value of the carrier wave signal the gain of the first derivative of the carrier wave signal may be varied so that the shape of the resulting carrier wave signal varies between the signal shapes given at 19 and 20.

FIG. 9 shows the basic structure of a circuit which, together with an H-bridge, can multiply the pulse-width modulated great-signal 7 with the pulse-width modulated small-signal 5. Compare FIG. 1.

The circuit may be designed such that the pulse-width modulated small-signals, which control each of the half-bridges A and B, are connected to the control legs 39 and 40 of the switches, each of said switches being formed by two very fast switches which may be switched approximately as a set of ideal change-over switches.

The inputs 31 and 32 of the change-over switches are connected to the outputs 37 and 38, respectively, of the H-bridge, while the outputs 33 and 36 as well as 34 and 35 of the switches are connected in pairs. The resulting differential voltage between the terminals 41 and 42 is then given by the pulse-width modulated great-signal of the H-bridge multiplied by the pulse-width modulated small-signal 5.

The differential signal between the terminals 41 and 42 will be proportional to the supply voltage 12, when the pulse widths of the pulse-width modulated great-signal 7 of the H-bridge are identical with the pulse-width modulated small-signal 5, and it will be seen that the differential signal, if applied to the carrier wave modulator, may compensate for variations in the supply voltage 12.

Furthermore, the differential signal between 41 and 42 will vary in proportion to the error (inevitable in practice) caused by a possible dead time, which means that the circuit in FIG. 9, if it is connected to the carrier wave modulator 11, can also compensate for unlinearities in the H-bridge which originate from the presence of dead time.

FIG. 10 at the top shows an example of a triangular wave carrier signal 3 and a resulting small-signal 43 which may be generated approximately ideally with a high degree of linearity. Moreover, shown below the small-signal 43 is the pulse-modulated great-signal 44 which occurs on some of the change-over switches (not shown). As will be seen, the pulse widths of the small-signal differ from the pulse widths of the great-signal, which is caused inter alia by the previously mentioned dead time during the switching sequence. If the pulse-width modulated small-signal 43 is now multiplied with the pulse-width modulated great-signal 44, a pulse-width modulated differential signal 45 is provided, as shown at the bottom of FIG. 10. This signal has an amplitude which is proportional to the supply voltage to the change-over switches, and a duty cycle which is inversely proportional to the difference between the pulse widths of the pulse-width modulated small-signal and the pulse-width modulated great-signal 44. By suitable processing of the differential signal 45, this signal is used as a control signal for the carrier wave modulator 11 in the same manner as the signal from the voltage sensor 10, cf. FIG. 1. It is noted that the differential signal 45, if it is connected to the carrier wave modulator 11, can correct the amplifier for errors in pulse widths as well as errors in pulse heights of the pulse-width modulated great-signal.

FIG. 11 shows the basic structure of a circuit forming a detector 10 which together with 2 MOSFETs are arranged in a half-bridge capable of multiplying the pulse-width modulated great-signal 7 with the pulse-width modulated small-signal 5, cf. FIG. 1.

The circuit may be constructed by connecting the pulse-width modulated small-signal, which controls the half-bridge, to the control legs 46 of the switch, said switch 55 being formed by three very fast switches which may be switched approximately as a set of ideal change-over switches.

The terminal 49 of the change-over switch is connected to the output 37 of the half-bridge, and the terminals 60 and 61 of the switch are connected to the zero conductor and a pure DC voltage, respectively, which is proportional to the unloaded supply voltage for the change-over switches, while the terminals 51 and 50, 59 and 60 as well as 57 and 58 of the switch are connected in pairs. The switch 62 provides an approximately ideal pulse-width modulated great-signal, and it thus exhibits properties which are identical with an ideal half-bridge. The resulting multiplicative error signals are therefore an exact indication of the error in the half-bridge alone. The resulting differential voltage between 53 and 54 is then given by the pulse-width modulated great-signal 7 of the half-bridge multiplied by the pulse-width modulated small-signal 5, and the inverted pulse-width modulated small-signal multiplied by the approximately ideal inverted pulse-width modulated great-signal.

The differential signal between the terminals 54 and 53 will be proportional to the supply voltage 12 when the pulse widths of the half-bridge are identical with the pulse-width modulated small-signal 5, and it will be seen from this that the differential signal, if applied to the carrier wave modulator, can compensate for variations in the supply voltage 12.

Additionally, the differential signal between 54 and 53 will vary proportionally to the multiplicative error which occurs in the change-over switches 23 and 24, which means that the circuit in FIG. 11, if used as the detector 10 in FIG. 1, can compensate for all multiplicative error signals in the half-bridge, originating inter alia from the presence of dead time, conducting resistance and variations in the supply voltage 12 to the change-over switches.

As will be appreciated from the foregoing, the invention provides an amplifier which is very universal and has a very low complexity.

The amplifier may be designed so that it may be used for many types of loads, without this interfering with the specifications of the amplifier.

Furthermore, the amplifier may be produced with relatively small dimensions compared to traditional amplifiers because of the high efficiency, and thereby no undesirably high heat emission.

The compensating circuit shown at 30 in FIG. 1 may be realized with a very simple circuit design which just differs slightly from a traditional carrier wave generator.

The invention claimed is:

1. A method in the compensation of unlinearities in an amplifier consisting of a pulse-width modulator (4), wherein a signal is pulse-width modulated to provide a pulse-width modulated small-signal (5), and wherein the pulse-width modulator (4) has an output controlling a set of change-over switches (6) which feed a load (9) with a pulse-width modulated great-signal (7) by means of a voltage supply (12), characterized in that the inevitable error, which manifests itself in that the pulse widths of the pulse-width modulated great-signal (7) differ from the pulse widths of the pulse-width modulated small-signal (5), is detected as an error signal which is used for changing the pulse-width modulation, said pulse-width modulated small-signal being varied in a manner which corresponds to the detected error signal.

2. A method according to claim 1, characterized in that the error signal is detected as a multiplicative error signal.

3. A method according to claim 2, characterized in that the detected multiplicative error signal is determined as the pulse-width modulated small-signal multiplied by the pulse-width modulated great-signal and the inverted small-signal multiplied by the inverted pulse-width modulated great-signal.

4. A method according to claims 1-3, characterized in that the pulse-width modulation is performed by means of a carrier wave signal.

5. A method according to claim 4, characterized in that a saw-toothed or triangular carrier wave signal is used.

6. A signal according to claim 5, characterized in that the slew rate of the carrier wave signal is adjusted with an external signal.

7. An amplifier of the type comprising a pulse-width modulator (4) adapted to pulse-width modulate a signal to provide a pulse-width modulated small-signal (5), said pulse-width modulated signal being fed to at least two change-over switches (6) adapted to connect and disconnect a voltage supply (12) to form a pulse-width modulated great-signal, and having means to compensate for error signals which occur in the signal paths between the pulse-width modulated great-signal (7) and the pulse-width modulated small-signal (5), characterized in that the means for compensating for the error signals are formed by a detector (10) which is adapted to detect deviations between the pulse widths of the great-signals and of the small-signals, and that the output of the detector (10) is connected to a controlled carrier wave generator (11).

8. An amplifier according to claim 7, characterized in that the detector (10) is adapted to multiply the pulse-width modulated small-signal with the pulse-width modulated great-signal and to multiply the inverted pulse-width modulated small-signal with the inverted pulse-width modulated great-signal.

9. An amplifier according to claim 7 or 8, characterized in that the controllable carrier wave generator (11) is adapted to keep the frequency of the carrier wave constant.

10. An amplifier according to claims 7 or 8, characterized in that the controllable carrier wave generator (11) is adapted to change the slew rate of the carrier wave on the basis of the detected multiplicative error signal.

11. Use of a method and an amplifier according to claims 1, 2 and 5-8 in a negative feedback system.

12. Use of a method and an amplifier according to claims 1, 2 and 5-8 for the power control of resistive and reactive loads.

\* \* \* \* \*